(12) United States Patent
Zhao et al.

(10) Patent No.: US 11,106,098 B2
(45) Date of Patent: Aug. 31, 2021

(54) PIXEL ARRANGEMENT STRUCTURE, DISPLAY SUBSTRATE, DISPLAY APPARATUS, AND MASK PLATE

(71) Applicant: BOE TECHNOLOGY GROUP CO., LTD., Beijing (CN)

(72) Inventors: Hui Zhao, Beijing (CN); Jing Yu, Beijing (CN); Lujiang Huangfu, Beijing (CN); Wenjing Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 16/620,732

(22) PCT Filed: Dec. 27, 2018

(86) PCT No.: PCT/CN2018/124403
§ 371 (c)(1),
(2) Date: Dec. 9, 2019

(87) PCT Pub. No.: WO2019/153939
PCT Pub. Date: Aug. 15, 2019

(65) Prior Publication Data
US 2020/0142265 A1    May 7, 2020

(30) Foreign Application Priority Data
Feb. 9, 2018  (CN) .......................... 201810136337.3

(51) Int. Cl.
*H01L 27/32*   (2006.01)
*G02F 1/1343*  (2006.01)

(52) U.S. Cl.
CPC ...... *G02F 1/134336* (2013.01); *H01L 27/326* (2013.01)

(58) Field of Classification Search
CPC ......... G02F 1/134336; G02F 1/133514; G02F 1/1333; G02F 2201/52; H01L 27/326;
(Continued)

(56) References Cited

U.S. PATENT DOCUMENTS

| 4,652,912 | A  | 3/1987 | Masubuchi |
| 9,655,201 | B2 | 5/2017 | Chu |

(Continued)

FOREIGN PATENT DOCUMENTS

| CN | 105552102 A | 5/2016 |
| CN | 205355055 U | 6/2016 |

(Continued)

*Primary Examiner* — Sitaramarao S Yechuri

(57) ABSTRACT

A pixel arrangement structure, a display substrate, a display device, and a mask are provided. The pixel arrangement structure includes: a first repeating unit and a second repeating unit. The first repeating unit includes a first sub-pixel, a second sub-pixel, and two third sub-pixels, and the second repeating unit includes two fourth sub-pixels, a fifth sub-pixel, and a sixth sub-pixel. In a first direction, the two third sub-pixels are between the first sub-pixel and the second sub-pixel, and the two fourth sub-pixels are between the fifth sub-pixel and the sixth sub-pixel. The two fourth sub-pixels are arranged along the first direction, the two third sub-pixels are arranged along a second direction, and the first direction and the second direction are not parallel to each other.

20 Claims, 8 Drawing Sheets

(58) Field of Classification Search
CPC . H01L 1/3216; H01L 1/3213; H01L 27/3218;
G09F 9/33
See application file for complete search history.

(56) References Cited

U.S. PATENT DOCUMENTS

| | | | |
|---|---|---|---|
| 10,535,718 B2 | 1/2020 | Jin | |
| 2013/0234917 A1 | 9/2013 | Lee | |
| 2015/0214280 A1* | 7/2015 | Furuie | H01L 27/3216 |
| | | | 257/89 |
| 2017/0309691 A1 | 10/2017 | Madigan | |
| 2017/0317150 A1* | 11/2017 | Chung | H01L 27/3216 |
| 2019/0378882 A1* | 12/2019 | Zhang | H01L 27/3213 |

FOREIGN PATENT DOCUMENTS

| | | |
|---|---|---|
| CN | 105826348 A | 8/2016 |
| CN | 107293571 A | 10/2017 |

\* cited by examiner

PIXEL ARRANGEMENT STRUCTURE, DISPLAY SUBSTRATE, DISPLAY APPARATUS, AND MASK PLATE

CROSS-REFERENCE

The present application claims priority of Chinese patent application No. 201810136337.3, filed on Feb. 9, 2018, the disclosure of which is incorporated herein by reference as part of the application.

TECHNICAL FIELD

Embodiments of the present disclosure relate to a pixel arrangement structure, a display substrate, a display device, and a mask.

BACKGROUND

With the development of display technology, people have higher and higher requirements for a resolution of a display device. For a high-resolution (for example, 4K resolution) product, it is necessary to increase the PPI (pixel per inch) of the display panel, thereby increasing the process difficulty and the cost of manufacturing the display panel. The virtual pixel technology can reduce the number of physical sub-pixels by sharing part of the sub-pixels, thereby reducing the density of the physical sub-pixels and increasing the PPI of the display panel in a case where the physical resolution of the display panel is no changed.

SUMMARY

At least one embodiment of the present disclosure provides a pixel arrangement structure, which comprises: a first repeating unit and a second repeating unit. The first repeating unit comprises a first sub-pixel, a second sub-pixel, and two third sub-pixels, and the second repeating unit comprises two fourth sub-pixels, a fifth sub-pixel, and a sixth sub-pixel. In a first direction, the two third sub-pixels are between the first sub-pixel and the second sub-pixel, and the two fourth sub-pixels are between the fifth sub-pixel and the sixth sub-pixel, the two fourth sub-pixels are arranged along the first direction, the two third sub-pixels are arranged along a second direction, and the first direction and the second direction are not parallel to each other.

For example, in the pixel arrangement structure provided by an embodiment of the present disclosure, the first repeating unit and the second repeating unit are arranged along the first direction.

For example, in the pixel arrangement structure provided by an embodiment of the present disclosure, in the first direction, the second sub-pixel and the fifth sub-pixel are adjacent to each other, and the second sub-pixel and the fifth sub-pixel are configured to display different colors, respectively.

For example, in the pixel arrangement structure provided by an embodiment of the present disclosure, the first direction and the second direction are perpendicular to each other.

For example, in the pixel arrangement structure provided by an embodiment of the present disclosure, the first repeating unit and the second repeating unit are alternately arranged along the first direction to form a repeating unit row, and a plurality of repeating unit rows are arranged along the second direction.

For example, in the pixel arrangement structure provided by an embodiment of the present disclosure, in the second direction, an extension line of a line connecting centers of two third sub-pixels of a first repeating unit in an even-numbered row of the plurality of repeating unit rows does not coincide with an extension line of a line connecting centers of two third sub-pixels of a first repeating unit in an odd-numbered row of the plurality of repeating unit rows.

For example, in the pixel arrangement structure provided by an embodiment of the present disclosure, the extension line of the line connecting the centers of the two third sub-pixels of the first repeating unit in the odd-numbered row passes through a center of an interval between the first repeating unit and the second repeating unit, which are adjacent, of the even-numbered row.

For example, in the pixel arrangement structure provided by an embodiment of the present disclosure, a distance between centers of the two third sub-pixels is greater than a half of a length of the first sub-pixel along the second direction, and a distance between centers of the two fourth sub-pixels is greater than a half of a length of the fifth sub-pixel along the second direction, a minimum distance, along the second direction, between boundaries of third sub-pixels of two first repeating units which are in adjacent odd-numbered rows of the plurality of repeating unit rows and in a same column is greater than 1.5 times of the length of the first sub-pixel along the second direction.

For example, in the pixel arrangement structure provided by an embodiment of the present disclosure, in the first direction, the second sub-pixel of the first repeating unit and the fifth sub-pixel of the second repeating unit are adjacent to each other, and the first sub-pixel of the first repeating unit and the sixth sub-pixel of the second repeating unit are adjacent to each other. In the first repeating unit, a minimum distance between boundaries of the two third sub-pixels along the second direction is greater than a minimum distance between a boundary of the second sub-pixel and a boundary of the fifth sub-pixel that is adjacent to the second sub-pixel along the first direction, and/or the minimum distance between the boundaries of the two third sub-pixels along the second direction is greater than a minimum distance between a boundary of the first sub-pixel and a boundary of the sixth sub-pixel that is adjacent to the first sub-pixel along the first direction. In the second repeating unit, a minimum distance between boundaries of the two fourth sub-pixels along the first direction is greater than the minimum distance between the boundary of the second sub-pixel and the boundary of the fifth sub-pixel that is adjacent to the second sub-pixel along the first direction, and/or the minimum distance between the boundaries of the two fourth sub-pixels along the first direction is greater than the minimum distance between the boundary of the first sub-pixel and the boundary of the sixth sub-pixel that is adjacent to the first sub-pixel along the first direction.

For example, in the pixel arrangement structure provided by an embodiment of the present disclosure, in the first repeating unit, a minimum distance between boundaries of the two third sub-pixels along the second direction is greater than a half of a length of one of the two third sub-pixels along the second direction, and is smaller than a length of the first sub-pixel along the second direction, in the second repeating unit, a minimum distance between boundaries of the two fourth sub-pixels along the first direction is greater than a half of a length of one of the two fourth sub-pixels along the first direction, and is smaller than a length of the fifth sub-pixel along the second direction.

For example, in the pixel arrangement structure provided by an embodiment of the present disclosure, two first repeating units constitute a first repeating unit group, and two second repeating units constitute a second repeating unit group, in the first direction, the first repeating unit group and the second repeating unit group are alternately arranged, in the first repeating unit group, the two first repeating units are arranged along the first direction; in the second repeating unit group, the two second repeating units are arranged along the first direction.

For example, in the pixel arrangement structure provided by an embodiment of the present disclosure, in the first repeating unit, a line connecting a center of the first sub-pixel and a center of the second sub-pixel is a first center line, and a line connecting centers of the two third sub-pixels is a second center line, the two third sub-pixels are symmetrically arranged with respect to the first center line, and the first sub-pixel and the second sub-pixel are symmetrically arranged with respect to the second center line.

For example, in the pixel arrangement structure provided by an embodiment of the present disclosure, the first center line and the second center line are perpendicular to each other.

For example, in the pixel arrangement structure provided by an embodiment of the present disclosure, in the second repeating unit, a line connecting a center of the fifth sub-pixel and a center of the sixth sub-pixel is a third center line, the two fourth sub-pixels are symmetrically arranged with respect to a perpendicular bisector of the third center line, and the fifth sub-pixel and the sixth sub-pixel are also symmetrically arranged with respect to the perpendicular bisector of the third center line.

For example, in the pixel arrangement structure provided by an embodiment of the present disclosure, in the second repeating unit, centers of the two fourth sub-pixels are on the third center line.

For example, in the pixel arrangement structure provided by an embodiment of the present disclosure, an area of the first sub-pixel and an area of the second sub-pixel are both greater than an area of either of the two third sub-pixels, and an area of the fifth sub-pixel and an area of the sixth sub-pixel are both greater than an area of either of the two fourth sub-pixels.

For example, in the pixel arrangement structure provided by an embodiment of the present disclosure, a length of the first sub-pixel in the second direction is greater than a length of the first sub-pixel in the first direction, and a length of the second sub-pixel in the second direction is greater than a length of the second sub-pixel in the first direction; a length of the fifth sub-pixel in the second direction is greater than a length of the fifth sub-pixel in the first direction, and a length of the sixth sub-pixel in the second direction is greater than a length of the sixth sub-pixel in the first direction.

For example, in the pixel arrangement structure provided by an embodiment of the present disclosure, the first sub-pixel and the fifth sub-pixel are red sub-pixels, the second sub-pixel and the sixth sub-pixel are blue sub-pixels, and the two third sub-pixels and the two fourth sub-pixels are green sub-pixels.

At least one embodiment of the present disclosure provides a display substrate, which comprises: a base substrate; and a plurality of sub-pixels on the base substrate. The plurality of sub-pixels adopt the pixel arrangement structure according to any one of the above embodiments.

At least one embodiment of the present disclosure provides a display device, which comprises the display substrate according to the above embodiment.

At least one embodiment of the present disclosure provides a mask, which is used for forming the pixel arrangement structure according to any one of the above embodiments, the mask comprises: a first opening, configured to form the two third sub-pixels; and a second opening, configured to form the two fourth sub-pixels. A length of the first opening along the second direction is greater than a length of the first opening along the first direction, and a length of the second opening along the second direction is smaller than a length of the second opening along the first direction.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1A:
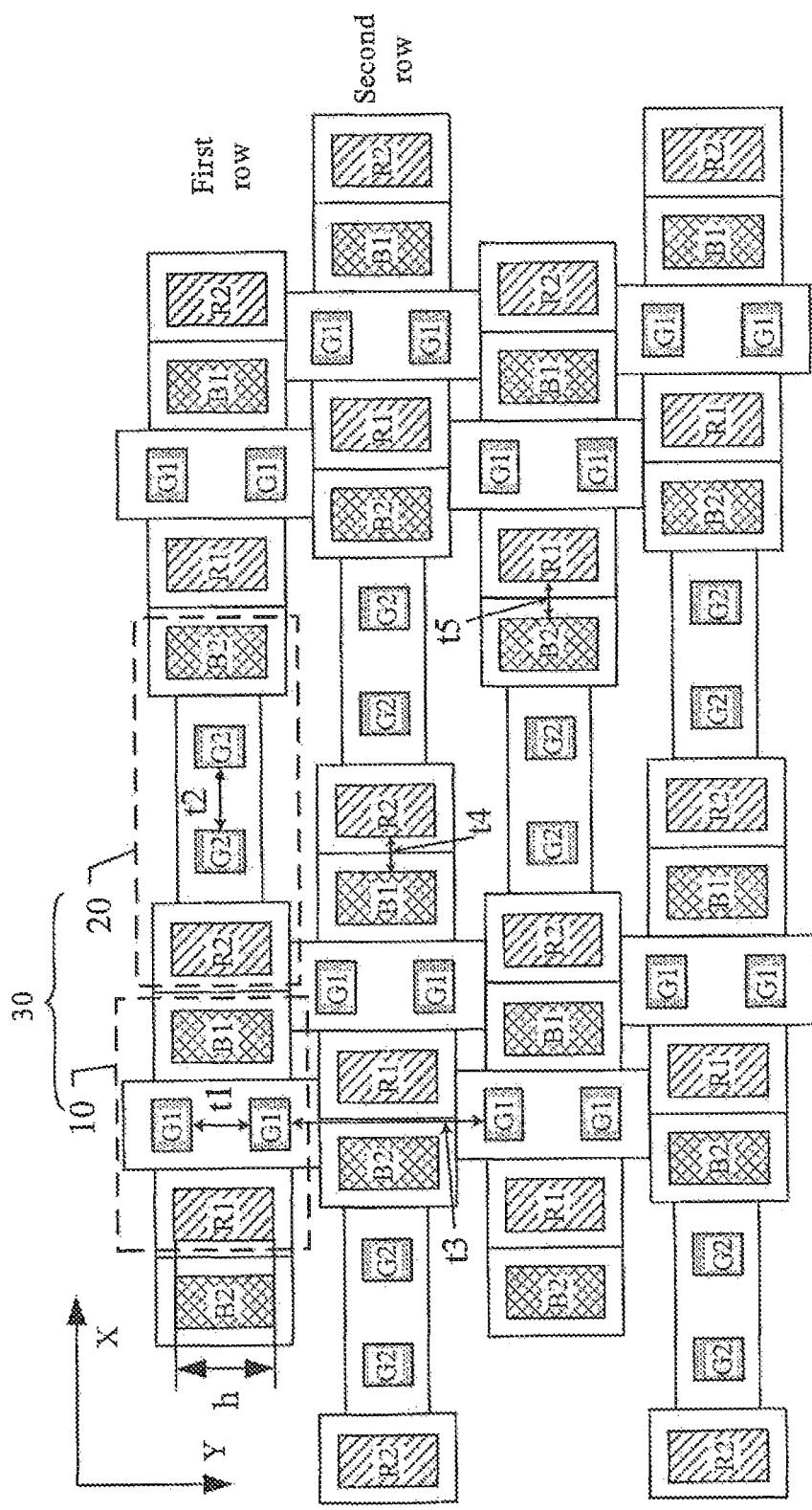
FIG. 1A is a schematic diagram of a pixel arrangement structure provided by an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may comprise an electrical connection/coupling, directly or indirectly. The terms, "on," "under," "left," "right," or the like are only used to indicate relative position relationship, and when the position of the object which is described is changed, the relative position relationship may be changed accordingly.

In order to keep the following descriptions of the embodiments of the present disclosure clear and concise, the present disclosure omits detailed descriptions of known functions and known components.

Currently, in a display panel, three adjacent sub-pixels (a red sub-pixel, a blue sub-pixel, and a green sub-pixel) or four adjacent sub-pixels (a red sub-pixel, a blue sub-pixel, a green sub-pixel, and a white sub-pixel) are mainly used to constitute a real pixel for display. In this case, the display resolution and the visual resolution of the display panel are the same, and it is difficult to achieve a high PPI for the display panel; on the other hand, because the number of sub-pixels is three times of the number of pixels, that is, the number of sub-pixels is large, and therefore, the manufacture process of the display panel is difficult. Where the display resolution of the display panel is equivalent to the resolution level of the human eyes, the difference of the resolutions of different color sub-pixels recognized by the human eyes can be utilized to change the mode in which the three sub-pixels (that is, the red sub-pixel, the blue sub-pixel, and the green sub-pixel) constitute a pixel. The virtual pixel technology is achieved by sharing a part of the sub-pixels by different pixels, thereby increasing the visual resolution of the display panel under the same display resolution, reducing the process difficulty and the cost of manufacturing the display panel, and improving the yield of the display panel. The shared sub-pixels are sub-pixels with lower position resolutions. For example, position resolutions of the human eyes to the blue sub-pixel and the red sub-pixel are lower than the position resolution of the human eyes to the green sub-pixel, so that the shared sub-pixels may be red sub-pixels and/or blue sub-pixels.

At least one embodiment of the present disclosure provides a pixel arrangement structure, a display substrate, a display device, and a mask, by arranging two adjacent green sub-pixels in a pair along different directions, and thus in a case where a fine metal mask (FMM) is formed by a stretching net method, the tension in a single direction is reduced, thereby reducing the process difficulty and the cost of the FMM.

In the following descriptions of the present disclosure, "adjacent" does not mean that physical positions of two sub-pixels, two repeating units, or two repeating unit groups are directly adjacent in a first direction X (and/or a second direction Y), but means that there are no sub-pixels between the two sub-pixels, the two repeating units, or the two repeating unit groups.

In the following, embodiments of the present disclosure will be described in detail with reference to the accompanying drawings, but the present disclosure is not limited to the specific embodiments.

Figure 1B:
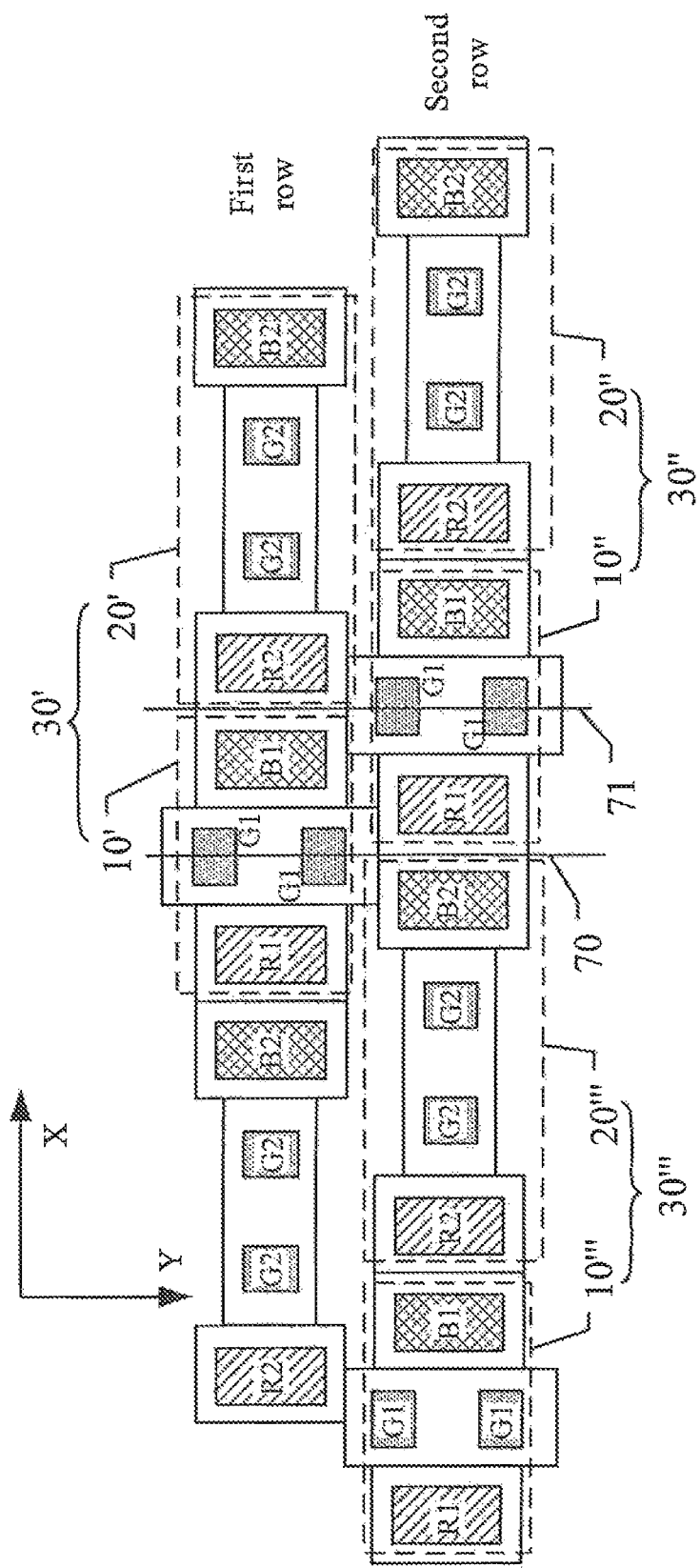
FIG. 1B is a schematic diagram of partial arrangement of a pixel arrangement structure provided by an embodiment of the present disclosure.
Figure 2:
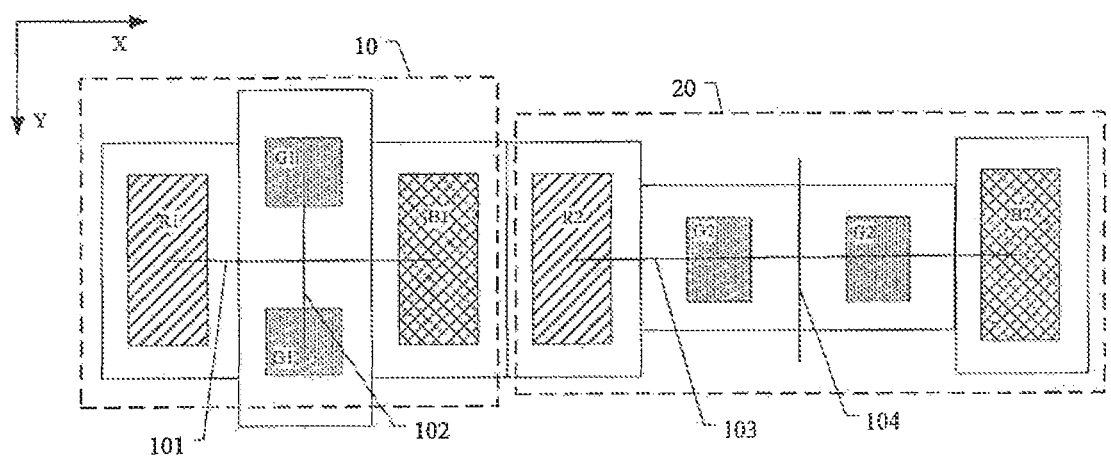
FIG. 2 is a partial structure diagram of a first repeating unit and a second repeating unit in a pixel arrangement structure provided by an embodiment of the present disclosure.

FIG. 1A is a schematic diagram of a pixel arrangement structure provided by an embodiment of the present disclosure; FIG. 1B is a schematic diagram of partial arrangement of a pixel arrangement structure provided by an embodiment of the present disclosure; and FIG. 2 is a partial structure diagram of a first repeating unit and a second repeating unit in a pixel arrangement structure provided by an embodiment of the present disclosure.

For example, as shown in FIG. 1A, the pixel arrangement structure provided by the embodiment of the present disclosure may comprise a first repeating unit 10 and a second repeating unit 20, the first repeating unit 10 comprises a first sub-pixel R1, a second sub-pixel B1, and two third sub-pixels G1, and the second repeating unit 20 comprises two fourth sub-pixels G2, a fifth sub-pixel R2, and a sixth sub-pixel B2. In a first direction X, in the first repeating unit 10, the two third sub-pixels G1 are located between the first sub-pixel R1 and the second sub-pixel B1, and in the second repeating unit 20, two fourth sub-pixels G2 are located between the fifth sub-pixel R2 and the sixth sub-pixel B2. The two third sub-pixels G1 are arranged along a second direction Y, the two fourth sub-pixels G2 are arranged along the first direction X, and the first direction X and the second direction Y are not parallel to each other.

For example, four sub-pixels in each first repeating unit 10 form two pixels, and the first sub-pixel and the second sub-pixel in the first repeating unit 10 are shared by the two pixels, respectively. Similarly, four sub-pixels in each second repeating unit 20 also form two pixels, and the fifth sub-pixel and the sixth sub-pixel in the second repeating unit 20 are shared by the two pixels, respectively. Pixels in a plurality of first repeating units 10 and pixels in a plurality of second repeating units 20 form a pixel array, in a first direction of the pixel array, a density of the sub-pixels is 1.5 times of a density of virtual pixels, and in a second direction of the pixel array, a density of the sub-pixels is 1.5 times of a density of virtual pixels.

It should be noted that, first, because the first sub-pixel and the second sub-pixel are shared by two adjacent pixels, the boundary of each pixel is very blurred, therefore, the embodiments of the present disclosure do not limit the shape of each pixel. The pixel in the embodiments of the present disclosure is not a pixel in a strict sense, that is, is not a pixel defined by complete one red sub-pixel, one green sub-pixel, and one blue sub-pixel. Therefore, the pixel in the present disclosure may be referred to as a virtual pixel.

Second, those skilled in the art should know that, based on the pixel arrangement structure of the present disclosure, the pixels and the first sub-pixel, the second sub-pixel, and the third sub-pixel in each pixel should be distributed as uniformly as possible.

Third, the first direction and the second direction identified in the drawings of the embodiments of the present disclosure are all identified from a macroscopic perspective, that is, because the density of the sub-pixels is 1.5 times of the density of the pixels, and it is guaranteed that the pixels and the respective sub-pixels in the pixels are distributed as uniformly as possible as a whole, therefore, the first direction may not be exactly a straight line but a wavy line from a microscopic perspective, similarly, the second direction is the same.

For example, the first direction X and the second direction Y may be perpendicular to each other.

For example, the first repeating unit 10 and the second repeating unit 20 are arranged along the first direction X, for example, are arranged in sequence.

For example, as shown in FIG. 2, in the first repeating unit 10, a line connecting a center of the first sub-pixel R1 and a center of the second sub-pixel B1 is a first center line 101, and a line connecting centers of the two third sub-pixels G1 is a second center line 102. A length of the first center line 101 is greater than a length of the second center line 102.

For example, the first center line 101 and the second center line 102 are perpendicular to each other, and the first center line 101 is parallel to the first direction X, and the second centerline 102 is parallel to the second direction Y.

For example, the first sub-pixel R1 and the second sub-pixel B1 are symmetrically arranged with respect to the second center line 102, and the centers of the two third sub-pixels G1 are symmetrically arranged with respect to the first center line 101. That is, the center of the first sub-pixel R1, the center of the second sub-pixel B1, and the centers of the two third sub-pixels G1 may be four vertices of a diamond whose diagonals are the first center line 101 and the second center line 102, respectively.

For example, as shown in FIG. 2, in the second repeating unit 20, a line connecting a center of the fifth sub-pixel R2 and a center of the sixth sub-pixel B2 is a third center line 103. The two fourth sub-pixels G2 are symmetrically arranged with respect to a perpendicular bisector 104 of the third center line 103, and the fifth sub-pixel R2 and the sixth sub-pixel B2 are also symmetrically arranged with respect to the perpendicular bisector 104 of the third center line 103.

For example, the centers of the two fourth sub-pixels G2 are located on the third center line 103, that is, the centers of the two fourth sub-pixels G2 may be symmetrically arranged with respect to the perpendicular bisector 104 of the third center line 103.

For example, the third center line 103 may be parallel to the first direction X. In the first direction X, an extension line of the first center line 101 coincides with the third center line 103, that is, the center of the first sub-pixel R1, the center of the second sub-pixel B1, the centers of the two fourth sub-pixels G2, the center of the fifth sub-pixel R2, and the center of the sixth sub-pixel B2 are all located on a straight line.

In addition, in the embodiments of the present disclosure, the "center" (for example, a theoretical center) of a sub-pixel may refer to a geometric center of an ideal shape of a sub-pixel (for example, the first sub-pixel, the second sub-pixel, or the third sub-pixel) unless otherwise specified. When designing a pixel arrangement structure, the sub-pixel is typically designed to have a regular shape, such as a hexagon shape, a pentagon shape, a trapezoid shape, or other shape. When designing, the center of the sub-pixel may be the geometric center of the regular shape described above. However, in the actual manufacturing process, the shape of the formed sub-pixel generally deviates from the regular shape of the above design. For example, corners of the above regular shapes may become rounded, and therefore the shape of the sub-pixel may be a fillet shape. The shape of the actually formed sub-pixel may also have other variations from the design shape. For example, the shape of a sub-pixel which is designed as a hexagon shape may become an approximately ellipse shape in an actual manufacture process. Therefore, the center of the sub-pixel may not be the strict geometric center of the irregular shape of the formed sub-pixel. In the embodiments of the present disclosure, the center of the sub-pixel may have a certain offset from the geometric center of the shape of the sub-pixel. The center of the sub-pixel refers to any point in a region enclosed by specific points on radiant line segments from the geometric center of the sub-pixel to respective points of the edge of the sub-pixel, and the specific points on the radiant line segments are at positions with distances of ⅓ the length of the radiation line segments from the geometric center. The definition of the center of the sub-pixel can be applied to define the center of the sub-pixel of a regular shape, and can also be applied to define the center of the sub-pixel of an irregular shape.

As described above, the shape of the actual manufactured sub-pixel may deviate from the designed shape of the sub-pixel because of various manufacturing errors. Therefore, the position of the center of the sub-pixel and the position relationship between the center of the sub-pixel and the positions of other objects in the present disclosure may also have certain errors. For example, for a line connecting centers of sub-pixels or a line passing through a center of a sub-pixel, if the lines satisfy corresponding other definitions (for example, an extending direction), it is possible as long as the lines pass through the region enclosed by the specific points on the above-mentioned radiant line segments. For another example, the center of the sub-pixel is located on a certain line, which means that the certain line passes through the region enclosed by the specific points on the above-mentioned radiation line segments. Furthermore, for the coincidence described in the present disclosure, it is meant that at least 70% of the area of the corresponding sub-pixel or other component can be overlapped; for the mirror symmetry described in the present disclosure, it is meant that at least 70% of the area of the corresponding sub-pixel can be overlapped after the mirroring operation.

For example, an area of the first sub-pixel R1 and an area of the second sub-pixel B1 are both greater than an area of either of the two third sub-pixels G1, and an area of the fifth sub-pixel R2 and an area of the sixth sub-pixel B2 are both greater than an area of either of the two fourth sub-pixels G2. For example, a sum of the areas of the two third sub-pixels G1 is the same as the area of the first sub-pixel R1 or the area of the second sub-pixel B1, and a sum of the areas of the two fourth sub-pixels G2 is the same as the area of the fifth sub-pixel R2 or the area of the sixth sub-pixel B2. However, the present disclosure is not limited in this aspect.

It should be noted that the area of each sub-pixel may be specifically set according to the light emitting efficiency of a light emitting material. For example, if the light emitting efficiency of the light emitting material is high, the area of the sub-pixel may be small; and the light emitting efficiency of the light emitting material is low, the area of the sub-pixel may be large.

For example, shapes of the first sub-pixel R1 and the second sub-pixel B1 may be the same and areas of the first sub-pixel R1 and the second sub-pixel B1 may be the same, and shapes of the fifth sub-pixel R2 and the sixth sub-pixel B2 may be the same and areas of the fifth sub-pixel R2 and the sixth sub-pixel B2 may be the same. For another example, shapes of the first sub-pixel R1 and the fifth sub-pixel R2 may be the same and areas of the first sub-pixel R1 and the fifth sub-pixel R2 may be the same, that is, shapes of all the first sub-pixel R1, the second sub-pixel B1, the fifth sub-pixel R2, and the sixth sub-pixel B2 are the same and areas of all the first sub-pixel R1, the second sub-pixel B1, the fifth sub-pixel R2, and the sixth sub-pixel B2 are the same.

For example, the shape of the first sub-pixel R1 may comprise a rectangle shape, a hexagon shape, a long ellipse shape, or the like. The hexagon shape may be an equilateral hexagon shape or the like.

Here, it should be noted that ideal shapes of the first sub-pixel R1 and the second sub-pixel B1 are hexagon shapes, but in the actual manufacturing process of the FMM, because the metal etching may cause a draft angle, where the FMM is used to form the first sub-pixel R1 and the second sub-pixel B1 by an evaporation process, the shapes of the formed first sub-pixel R1 and the formed second sub-pixel B1 may not be standard hexagon shapes, for example, the shapes may be shapes in which one corner of a hexagon shape is removed. Although in the drawings, the shape of each sub-pixel comprises an angle strictly formed by two line segments, in some embodiments, the shape of each sub-pixel may be a fillet shape. That is to say, on the basis of the above various shapes, the corners of each sub-pixel are rounded. For example, in the case where the light emitting layer is evaporated through a mask, the portion of the light emitting layer located at the corner may naturally form a rounded corner shape.

In addition, in the embodiments of the present disclosure, the shape of the sub-pixel may refer to a shape of a portion where a pixel electrode and a light emitting layer are in contact with each other. For example, for each sub-pixel, an area of the pixel electrode may be slightly larger than an area of the light emitting layer, or the area of the light emitting layer may be slightly larger than the area of the pixel electrode, which is not particularly limited in the embodiments of the present disclosure. For example, the light emitting layer herein may comprise an electroluminescent layer itself and other functional layers on two sides of the electroluminescent layer, for example, the other functional layers comprise a hole injection layer, a hole transport layer, an electron injection layer, an electron transport layer, and the like. In some embodiments, the shape of the pixel may also be defined by a pixel defining layer. For example, a lower electrode (for example, an anode) of a light emitting diode may be disposed under the pixel defining layer, the pixel defining layer comprises an opening for defining a pixel, and the opening exposes a portion of the lower electrode, in a case where the light emitting layer is formed in the opening of the pixel defining layer, the light emitting layer is in contact with the lower electrode, so that the light emitting layer formed in the opening of the pixel defining layer can be driven to emit light. Therefore, in this case, the opening of the pixel defining layer defines the shape of the sub-pixel.

For example, as shown in FIG. 1A, a length of the first sub-pixel R1 in the second direction Y is greater than a length of the first sub-pixel R1 in the first direction X, and a length of the second sub-pixel B1 in the second direction Y is greater than a length of the second sub-pixel B1 in the first direction X; a length of the fifth sub-pixel R2 in the second direction Y is greater than a length of the fifth sub-pixel R2 in the first direction X, and a length of the sixth sub-pixel B2 in the second direction Y is greater than a length of the sixth sub-pixel B2 in the first direction X. That is to say, for example, if the shape of the first sub-pixel R1 is a rectangle shape, a length of a side of the first sub-pixel R1 along the first direction X is smaller than a length of a side of the first sub-pixel R1 along the second direction Y. If the shape of the first sub-pixel R1 is a long ellipse shape, a line connecting two focal points of the long ellipse shape is substantially parallel to the second direction Y.

It should be noted that the length of each sub-pixel in the first direction X or the second direction Y may indicate a maximum length of each sub-pixel in the first direction X or the second direction Y. Taking the first sub-pixel R1 as an example, in a case where the shape of the first sub-pixel R1 is a rectangle shape, a maximum length of the first sub-pixel R1 along the first direction X is a length of a side of the rectangle shape in the first direction X, and a maximum length of the first sub-the pixel R1 in the second direction X is a length of a side of the rectangle shape in the second direction Y. In a case where the shape of the first sub-pixel R1 is a long ellipse shape, and a line connecting two focal points of the ellipse shape is substantially parallel to the second direction Y, a maximum length of the first sub-pixel R1 along the second direction Y is a distance between two intersections of the line connecting the two focal points and the circumference of the long ellipse shape, and a maximum length of the first sub-pixel R1 along the first direction X is a distance between two intersections of a perpendicular bisector of the line connecting the two focal points and the circumference of the long ellipse shape.

For example, the first sub-pixel R1 may be symmetrical with respect to a line in which the first center line 101 is located.

For example, shapes of the two third sub-pixels G1 are the same and areas of the two third sub-pixels G1 are the same, and shapes of the two fourth sub-pixels G2 are also the same and areas of the two fourth sub-pixels G2 are also the same. For another example, shapes of the third sub-pixel G1 and the fourth sub-pixel G2 may also be the same and areas of the third sub-pixel G1 and the fourth sub-pixel G2 may also be the same.

For example, each of the shapes of the third sub-pixel G1 and the fourth sub-pixel G2 comprises a rectangle shape (for example, a square shape), a pentagon shape, a diamond shape, or the like.

For example, the shapes of the two third sub-pixels G1 may be symmetrical with respect to the first center line 101. The shapes of the two fourth sub-pixels G2 may be symmetrical with respect to the perpendicular bisector 104 of the third center line 103.

For example, a spacing between the two third sub-pixels G1 and a spacing between the two fourth sub-pixels G2 may be specifically set according to the visual effect and the FMM stretching net manufacture process. The closer the spacing is, the simpler the FMM stretching net manufacture process is; and the farther the spacing is, the better the visual effect is.

For example, as shown in FIG. 2, the distance between the centers of the two third sub-pixels G1 (that is, the length of the second center line 102) is greater than a half of the length of the first sub-pixel R1 along the second direction Y, and the distance between the centers of the two fourth sub-pixel G2 is greater than a half of the length of the fifth sub-pixel R2 along the second direction Y.

It should be noted that, in the embodiments of the present disclosure, "a half of a length" is not a half of a maximum length of a sub-pixel in a certain direction in a strict sense. For example, as shown in FIG. 2, for the fifth sub-pixel R2, the length of the fifth sub-pixel R2 along the second direction Y may indicate a distance between two intersections of a straight line passing through the center of the fifth sub-pixel R2 and the boundary of the fifth sub-pixel R2 in the second direction Y, and "a half of a length" means a half of the distance between the two intersections. In addition, the "distance between centers of two sub-pixels" does not strictly refer to the distance between geometric centers of ideal shapes of the two sub-pixels, but may indicate the distance between centers of the two sub-pixels (that is, centers of actual shapes of the sub-pixels). Here, the center of the sub-pixel may indicate any point in the region enclosed by specific points on the radiation line segments described above.

For example, as shown in FIG. 1A, a minimum distance t3, along the second direction Y, between boundaries of third sub-pixels G1 of two first repeating units 10 which are located in adjacent odd-numbered rows and in a same column is greater than 1.5 times of the length of the first sub-pixel R1 along the second direction Y.

For example, as shown in FIG. 1A, in the first direction X, the second sub-pixel B1 of the first repeating unit 10 and the fifth sub-pixel R2 of the second repeating unit 20 are adjacent to each other, and the first sub-pixel R1 of the first repeating unit 10 and the sixth sub-pixel B2 of the second repeating unit 20 are adjacent to each other. In the first repeating unit 10, a minimum distance t1 between boundaries of the two third sub-pixels G1 along the second direction Y is greater than a minimum distance t4 between a boundary of the second sub-pixel B1 and a boundary of the fifth sub-pixel R2 that is adjacent to the second sub-pixel B1 along the first direction X, and/or the minimum distance t1 between boundaries of the two third sub-pixels G1 along the second direction Y is greater than a minimum distance t5 between a boundary of the first sub-pixel R1 and a boundary of the sixth sub-pixel B2 that is adjacent to the first sub-pixel R1 along the first direction X.

For example, as shown in FIG. 1A, in the second repeating unit 20, a minimum distance t2 between boundaries of the two fourth sub-pixels G2 along the first direction X is greater than the minimum distance t4 between a boundary of the second sub-pixel B1 and a boundary of the fifth sub-pixel R2 that is adjacent to the second sub-pixel B1 along the first direction X, and/or the minimum distance t2 of boundaries of the two fourth sub-pixels G2 along the first direction X is greater than the minimum distance t5 between a boundary of the first sub-pixel R1 and a boundary of the sixth sub-pixel B2 that is adjacent to the first sub-pixel R1 along the first direction X.

For example, as shown in FIG. 1A, in the first repeating unit 10, a minimum distance t1 between boundaries of the two third sub-pixels G1 along the second direction Y is greater than a half of a length of any one of the two third sub-pixels G1 along the second direction Y, and is smaller than a length h of the first sub-pixel R1 along the second direction Y. In the second repeating unit 20, a minimum distance t2 between boundaries of the two fourth sub-pixels G2 along the first direction X is greater than a half of a length of any one of the two fourth sub-pixels G2 along the first direction X, and is smaller than a length (for example, h) of the fifth sub-pixel along the second direction Y. Therefore, the third sub-pixels G1 and the fourth sub-pixels G2 can be arranged uniformly, and the smoothness and continuity of horizontal and vertical lines are ensured while reducing the process difficulty, and the sawtooth feeling is reduced.

It should be noted that, in the embodiments of the present disclosure, the shape of each sub-pixel is not an ideal geometric shape because of limitations of process conditions and process technologies, and the shape of each sub-pixel may be a rounded corner shape. For example, if the ideal shapes of the first sub-pixel R1 and the second sub-pixel B1 are hexagon shapes or rectangle shapes, in practice, the shapes of the first sub-pixel R1 and the second sub-pixel B1 may be approximately ellipse shapes. If the ideal shapes of the third sub-pixels G1 are pentagon shapes or rectangle shapes, in practice, the shapes of the third sub-pixels G1 may be approximately semi-circular shapes or circular shapes. Based on these cases, the line connecting centers of two sub-pixels has two intersections with boundaries of the shape of the two sub-pixels, and the "minimum distance between two sub-pixels" may indicate the distance between the two intersections on the two sub-pixels. For example, as shown in FIG. 1A, in the first repeating unit 10, the line connecting the centers of the two third sub-pixels G01 has two intersections with boundaries of the shape of the two third sub-pixels, and the distance between the two intersections is the minimum distance t1 between the boundaries of the two third sub-pixels G1 along the second direction Y. It should be noted that the line connecting the centers of the two third sub-pixels G1 is substantially parallel to the second direction Y.

In addition, in the embodiments of the present disclosure, the "boundary of a sub-pixel" indicates a boundary of a light emitting region of a sub-pixel, or indicates a boundary of a shape of a sub-pixel defined by an opening of a pixel defining layer. The light emitting region of a sub-pixel indicates a region that can emit light when the sub-pixel emits light.

For example, the two third sub-pixels G1 can be formed by one opening and the two fourth sub-pixels G2 also can be formed by one opening, thereby effectively reducing the process difficulty of the FMM. "The two third sub-pixels G1 being formed by one opening and the two fourth sub-pixels G2 being formed by one opening" indicate that in a case where light emitting layers of adjacent two third sub-pixels G1 or light emitting layers of adjacent two fourth sub-pixels G2 are evaporated, a single opening region of the FMM can be shared. In the opening region, only the portion of the light emitting material that is evaporated on the pixel electrode forms the third sub-pixel G1 or the fourth sub-pixel G2, so that the portion of the light emitting material evaporated on the pixel electrode can emit light, and the other light emitting material that is evaporated on an insulating paste cannot emit light. On the other hand, because the two third sub-pixels G1 are arranged along the second direction Y, and the two fourth sub-pixels G2 are arranged along the first direction X, in a case where the FMM is manufactured by a stretching net method, the tension in a single direction (for example, the second direction Y) is reduced, and the process difficulty and the cost of the FMM are reduced.

For example, in the first direction X, the first repeating unit 10 and the second repeating unit 20 are arranged adjacent to each other, and the second sub-pixel B1 and the fifth sub-pixel R2 are arranged adjacent to each other, and the second sub-pixel B1 and the fifth sub-pixel R2 are configured to display different colors. For example, if the second sub-pixel B1 displays a red color, the fifth sub-pixel R2 may display a blue color.

For example, the third sub-pixels G1 and the fourth sub-pixels G2 are green sub-pixels. The first sub-pixel R1 and the fifth sub-pixel R2 are red sub-pixels, and the second sub-pixel B1 and the sixth sub-pixel B2 are blue sub-pixels. However, the present disclosure is not limited thereto, the first sub-pixel R1 and the fifth sub-pixel R2 may also be blue sub-pixels, correspondingly, the second sub-pixel B1 and the sixth sub-pixel B2 are red sub-pixels.

It should be noted that, in the present disclosure, the descriptions about the first sub-pixel R1 apply to the second sub-pixel B1, the fifth sub-pixel R2, and the sixth sub-pixel B2 without contradiction.

For example, in one example, as shown in FIG. 1A, the first repeating unit 10 and the second repeating unit 20 are arranged along the first direction X to form a repeating unit row. A plurality of repeating unit rows are arranged along the second direction Y.

For example, in the second direction Y, an extension line of a line connecting centers of two third sub-pixels of a first repeating unit in an even-numbered row of the plurality of repeating unit rows does not coincide with an extension line of a line connecting centers of two third sub-pixels of a first repeating unit in an odd-numbered row of the plurality of repeating unit rows. That is, the center of the first repeating unit in the odd-numbered row and the center of the first repeating unit in the even-numbered row are staggered from each other. For example, the two third sub-pixels of the first repeating unit in the even-numbered row and the two third sub-pixels of the first repeating unit in the odd-numbered row are completely misaligned with each other in the second direction Y, that is, orthographic projections of the two third sub-pixels of the first repeating unit in the even-numbered row in the second direction Y and orthographic projections of the two third sub-pixels of the first repeating unit in the odd-numbered row in the second direction Y do not overlap with each other.

For example, the extension line of a line (that is, the second center line 102 in FIG. 2) connecting centers of two third sub-pixels G1 of a first repeating unit 10 in an odd-numbered row of the plurality of repeating unit rows passes through a center of an interval between the first repeating unit 10 and the second repeating unit 20, which are adjacent, of the even-numbered row. Therefore, by adjusting positions of repeating units of different rows, the third sub-pixels G1 and the fourth sub-pixels G2 are distributed uniformly, thereby improving the display effect and reducing the sawtooth feeling.

For example, as shown in FIG. 1A, the first repeating unit 10 and the second repeating unit 20 may constitute a repeating unit group 30, and in the repeating unit group 30, the first repeating unit 10 and the second repeating unit 20 are sequentially arranged along the first direction X, that is, in the first direction X, the first repeating unit 10 is located on the left side of the second repeating unit 20, and the second repeating unit 20 is located on the right side of the first repeating unit 10.

For example, an extension line of a line connecting centers of two third sub-pixels G1 of a first repeating unit 10 in a first row passes through a center of an interval between two adjacent repeating unit groups 30 in a second row. That is, in the first direction X, the second repeating unit 20 in the second row is located on the left side of the extension line of the line connecting the centers of the two third sub-pixels G1 of the first repeating unit 10 in the first row, and the first repeating unit 10 in the second row is located on the right side of the extension line of the line connecting the centers of the two third sub-pixels G1 of the first repeating unit 10 in the first row. It should be noted that, in the above descriptions, the extension line of the line connecting the centers of the two third sub-pixels G1 of the first repeating unit 10 in the first row passes through the interval between the first repeating unit 10 and the second repeating units 20 in the second row. As shown in FIG. 1B, a repeating unit group 30' is located in the first row, and the repeating unit group 30' comprises a first repeating unit 10' and a second repeating unit 20'; a repeating unit group 30'' and a repeating unit group 30''' are two adjacent repeating unit groups, and the repeating unit group 30'' and the repeating unit group 30''' are both located in the second row, the repeating unit group 30'' comprises a first repeating unit 10'' and a second repeating unit 20'', and the repeating unit group 30''' comprises a first repeating unit 10''' and a second repeating unit 20'''. An extension line 70 of the line connecting the centers of the two third sub-pixels G1 of the first repeating unit 10' passes through an interval (i.e., an interval between the first repeating unit 10'' and the second repeating unit 20') between the repeating unit group 30'' and the repeating unit group 30''', and the first repeating unit 10'' is located on the right side of the extension line 70, and the second repeating unit 20''' is located on the left side of the extension line 70.

For example, the extension line of the line connecting the centers of the two third sub-pixels G1 of the first repeating unit 10 in the second row passes through the center of the interval between the first repeating unit 10 and the second repeat 20 in the repeating unit group 30 in the first row, that is, in the first direction X, the first repeating unit 10 in the first row is located on the left side of the extension line of the line connecting the centers of the two third sub-pixels G1 of the first repeating unit 10 in the second row, and the second repeating unit 20 in the first row is located on the right side of the extension line of the line connecting the centers of the two third sub-pixels G1 of the first repeating unit 10 in the second row. It should be noted that, in the above descriptions, for example, the extension line of the line connecting the centers of the two third sub-pixels G1 of the first repeating unit 10 in the second row passes through the interval between the first repeating unit 10 and the second repeating unit 20 in the first row. As shown in FIG. 1B, an extension line 71 of the line connecting the centers of the two third sub-pixels G1 of the first repeating unit 10'' passes through a center of an interval between the first repeating unit 10' and the second repeating unit 20' in the repeating unit group 30', and the first repeating unit 10' is located on the left side of the extension line 71, and the second repeating unit 20' is located on the right side of the extension line 70.

For example, the first row may be an odd-numbered row, and accordingly, the second row may be an even-numbered row. However, the present disclosure is not limited thereto, the first row may also be an even-numbered row, and the second row may be an odd-numbered row.

Figure 3:
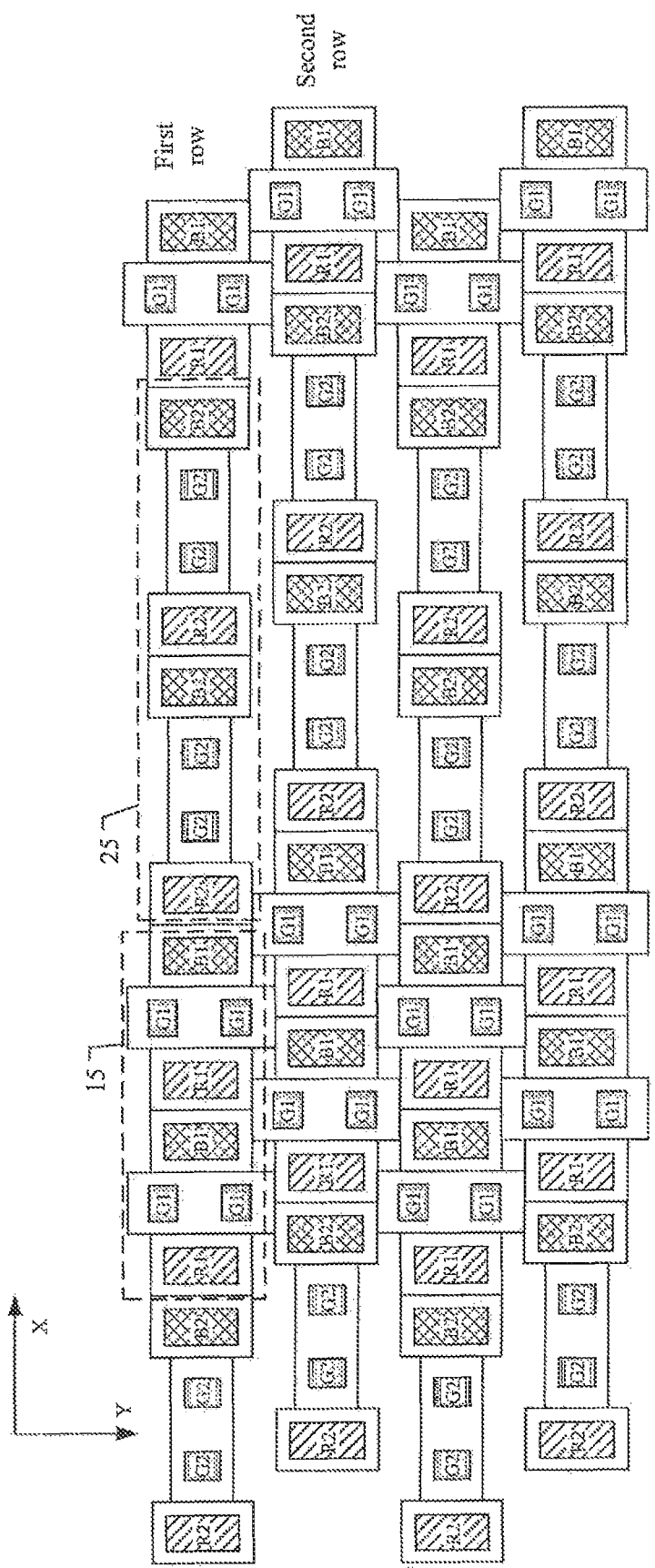
FIG. 3 is a schematic diagram of another pixel arrangement structure provided by an embodiment of the present disclosure.
Figure 4A:
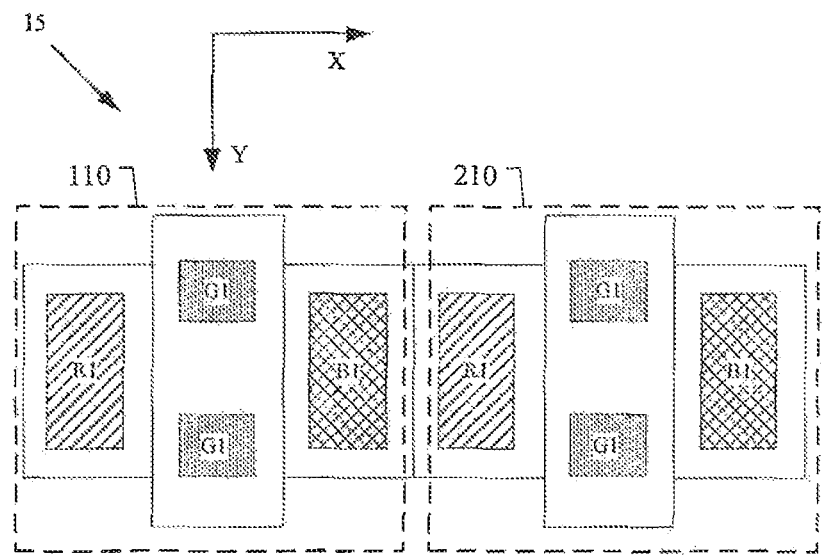
FIG. 4A is a schematic diagram of a first repeating unit group in the pixel arrangement structure shown in FIG. 3.
Figure 4B:
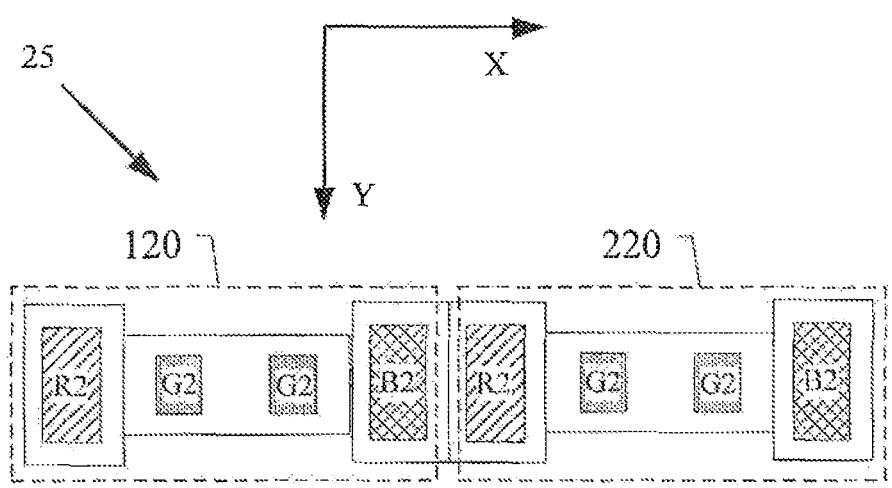
FIG. 4B is a schematic diagram of a second repeating unit group in the pixel arrangement structure shown in FIG. 3.

FIG. 3 is a schematic diagram of another pixel arrangement structure provided by an embodiment of the present disclosure, FIG. 4A is a schematic diagram of a first repeating unit group in the pixel arrangement structure shown in FIG. 3, and FIG. 4B is a schematic diagram of a second repeating unit group in the pixel arrangement structure shown in FIG. 3.

For example, in another example, as shown in FIG. 3, two first repeating units may constitute a first repeating unit group 15, and two second repeating units may constitute a second repeating unit group 25. In the first direction X, the first repeating unit group 15 and the second repeating unit group 25 are alternately arranged.

For example, in the first repeating unit group 15, the two first repeating units are arranged along the first direction X, and in the second repeating unit group 25, the two second repeating units are arranged along the first direction X.

For example, as shown in FIG. 4A, the first repeating unit group 15 comprises a first repeating unit 110 and a first repeating unit 210, and the first repeating unit 110 and the first repeating unit 210 are sequentially arranged along the first direction X, that is, in the first direction X, the first repeating unit 110 is located on the left side of the first repeating unit 210, and the first repeating unit 210 is located on the right side of the first repeating unit 110. As shown in FIG. 4B, the second repeating unit group 25 comprises a second repeating unit 120 and a second repeating unit 220, and the second repeating unit 120 and the second repeating unit 220 are sequentially arranged along the first direction X, that is, in the first direction X, the second repeating unit 120 is located on the left side of the second repeating unit 220, and the second repeating unit 220 is located on the right side of the second repeating unit 120.

For example, as shown in FIG. 3 and FIG. 4A, an extension line of a line connecting centers of two third sub-pixels G1 of one of the first repeating units, for example, the first repeating unit 110, of the first repeating unit group 15 in the first row passes through a center of an interval between the first repeating unit group 15 and the second repeating unit group 25, which are adjacent, in the second row, that is, in the first direction X, the adjacent second repeating unit and the first repeating unit in the second row are respectively located on two sides of the extension line of the line connecting the centers of the two third sub-pixels G1 of the first repeating unit 110 of the first repeating unit group 15 in the first row (For example, the second repeating unit and the first repeating unit that are adjacent in the second row are respectively located on the left side and the right side of the extension line). An extension line of a line connecting centers of two third sub-pixels G1 of the other first repeating unit, for example, the first repeating unit 210, of the first repeating unit group 15 in the first row passes through a center of an interval of the two first repeating units in the repeating unit group 15 in the second row.

For example, as shown in FIG. 3 and FIG. 4A, an extension line of a line connecting centers of the two third sub-pixels G1 of one of the first repeating units, for example, the first repeating unit 110, in the first repeating unit group 15 in the second row passes through a center of an interval of the two first repeating units in the first repeating unit group 15 in the first row. An extension of a line connecting centers of the other first repeating unit, for example, the first repeating unit 120, in the first repeating unit group 15 in the second row passes through a center of an interval between the first repeating unit group 15 and the second repeating unit group 25 that are adjacent in the first row. That is, in the first direction X, the first repeating unit and the second repeating unit that are adjacent in the first row are respectively located on two sides of the extension line of the line connecting the centers of the third sub-pixels G1 of the first repeating unit 120 of the first repeating unit group 15 in the second row (for example, the first repeating unit and the second repeating unit that are adjacent in the first row are respectively located on the left side and the right side of the extension line).

For example, the first row may be an odd-numbered row, and accordingly, the second row may be an even-numbered row. However, the present disclosure is not limited thereto, the first row may also be an even-numbered row, and the second row may be an odd-numbered row.

It should be noted that the arrangements of the first repeating units and the second repeating units shown in FIG. 1A and FIG. 3 are only illustrative and not limiting. The specific arrangement of the first repeating units and the second repeating units may be designed according to actual requirements. For example, a plurality of first repeating units (for example, three first repeating units, etc.) may constitute a first repeating unit group, and a plurality of second repeating units (for example, three second repeating units, etc.) may constitute a second repeating unit group, in the first direction X, the first repeating unit group and the second repeating unit group are alternately arranged. For another example, two first repeating units and one second repeating unit may constitute a repeating unit group, and a plurality of repeating unit groups are arranged in an array along the first direction and the second direction. In the repeating unit group, the two first repeating units and the second repeating unit are arranged along the first direction, and the second repeating unit is located between the two first repeating units. Alternatively, one first repeating unit and two second repeating units may constitute a repeating unit group, and a plurality of repeating unit groups are arranged in an array along the first direction and the second direction. In the repeating unit group, the first repeating unit and the two second repeating units are arranged along the first direction, and the first repeating unit is located between the two second repeating units.

Figure 5:
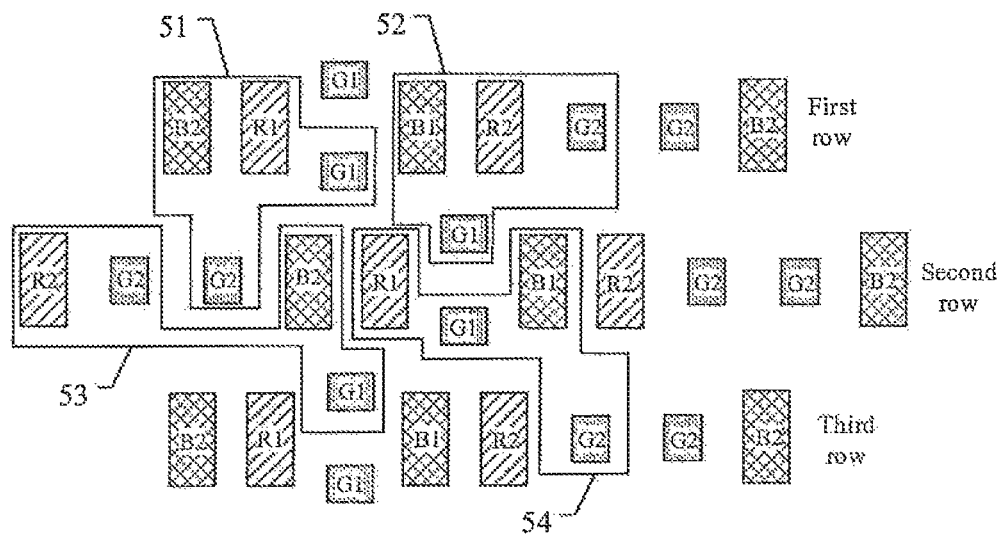
FIG. 5 is a schematic diagram of groups of pixel units of the pixel arrangement structure shown in FIG. 1.
Figure 6:
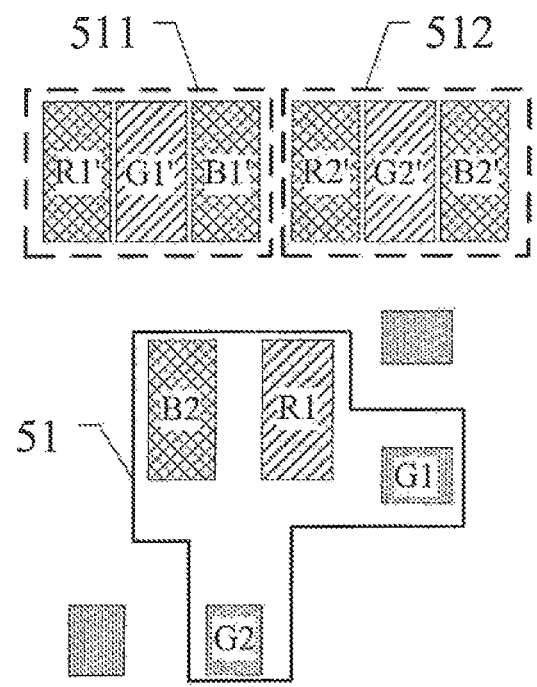
FIG. 6 is a schematic diagram of an algorithm corresponding to a first pixel unit shown in FIG. 5.

FIG. 5 is a schematic diagram of groups of pixel units of the pixel arrangement structure shown in FIG. 1, and FIG. 6 is a schematic diagram of an algorithm corresponding to a first pixel unit shown in FIG. 5. In order to illustrate clearly, FIG. 5 only shows three rows of repeating units.

For example, as shown in FIG. 5, in a first row, the pixel arrangement structure may comprise a first pixel unit 51 and a second pixel unit 52, and in a second row, the pixel arrangement structure may comprise a third pixel unit 53 and a fourth pixel unit 54.

For example, the first pixel unit 51 may comprise a first sub-pixel R1, a third sub-pixel G1, a fourth sub-pixel G2, and a sixth sub-pixel B2. The first sub-pixel R1 and the third sub-pixel G1 in the first pixel unit 51 belong to one first repeating unit, and the sixth sub-pixel B2 and the fourth sub-pixel G2 in the first pixel unit 51 respectively belong to two second repeating units. The first sub-pixel R1, the third sub-pixel G1, and the sixth sub-pixel B2 in the first pixel unit 51 are located in the first row, and the fourth sub-pixel G2 in the first pixel unit 51 is located in the second row. In the first pixel unit 51, the first sub-pixel R1, the third sub-pixel G1, the fourth sub-pixel G2, and the sixth sub-pixel B2 form two virtual pixels, for example, the first sub-pixel R1 and the third sub-pixel G1 form one virtual pixel, and the fourth sub-pixel G2 and the sixth sub-pixel B2 form the other virtual pixel. The first sub-pixel R1 and the sixth sub-pixel B2 are both shared by the two virtual pixels.

For example, the second pixel unit 52 comprises a second sub-pixel B1, a third sub-pixel G1, a fourth sub-pixel G2, and a fifth sub-pixel R2. The fourth sub-pixel G2 and the fifth sub-pixel R2 in the second pixel unit 52 belong to one second repeating unit, and the second sub-pixel B1 and the third sub-pixel G1 in the second pixel unit 52 respectively belong to two first repeating units. The second sub-pixel B1, the fourth sub-pixel G2, and the fifth sub-pixel R2 in the second pixel unit 52 are located in the first row, and the third sub-pixel G1 in the second pixel unit 52 is located in the second row. In the second pixel unit 52, the second sub-pixel B1, the third sub-pixel G1, the fourth sub-pixel G2, and the fifth sub-pixel R2 form two virtual pixels, for example, the second sub-pixel B1 and the third sub-pixel G1 form one virtual pixel, and the fourth sub-pixel G2 and the fifth sub-pixel R2 form the other virtual pixel. The second sub-pixel B1 and the fifth sub-pixel R2 are both shared by the two virtual pixels.

For example, the third pixel unit 53 comprises a third sub-pixel G1, a fourth sub-pixel G2, a fifth sub-pixel R2, and a sixth sub-pixel B2. The fourth sub-pixel G2, the fifth sub-pixel R2, and the sixth sub-pixel B2 in the third pixel unit 53 belong to one second repeating unit and are located in the second row; and the third sub-pixel G1 in the third pixel unit 53 is located in the third row. In the third pixel unit 53, the third sub-pixel G1, the fourth sub-pixel G2, the fifth sub-pixel R2, and the sixth sub-pixel B2 form two virtual pixels, for example, the fourth sub-pixel G2 and the fifth sub-pixel R2 form one virtual pixel, and the third sub-pixel G1 and the sixth sub-pixel B2 form the other virtual pixel. The fifth sub-pixel R2 and the sixth sub-pixel B2 are both shared by the two virtual pixels.

For example, the fourth pixel unit 54 comprises a first sub-pixel R1, a second sub-pixel B1, a third sub-pixel G1, and a fourth sub-pixel G2. The first sub-pixel R1, the second sub-pixel B1, and the third sub-pixel G1 in the fourth pixel unit 54 belong to one first repeating unit and are located in the second row; and the fourth sub-pixel G2 in the fourth pixel unit 54 is located in the third row. In the fourth pixel unit 54, the first sub-pixel R1, the second sub-pixel B1, the third sub-pixel G1, and the fourth sub-pixel G2 form two virtual pixels, for example, the first sub-pixel R1 and the third sub-pixel G1 form one virtual pixel, and the second sub-pixel B1 and the fourth sub-pixel G2 form the other virtual pixel. The first sub-pixel R1 and the second sub-pixel B1 are both shared by the two virtual pixels.

For example, if the first row is the odd-numbered row and the second row is the even-numbered row, in a case where the pixel arrangement structure is applied to a display panel, sub-pixels of all the odd-numbered rows on the display panel are divided according to the combination manner of the first pixel unit 51 and the second pixel unit 52, so to form a plurality of virtual pixels, and sub-pixels of all the even-numbered rows on the display panel are divided according to the combination manner of the third pixel unit 53 and the fourth pixel unit 54, so to form a plurality of virtual pixels. However, the present disclosure is not limited thereto, the first row may also be the even-numbered row, and the second row may be the odd-numbered row. In this case, sub-pixels of all the odd-numbered rows and sub-pixels of all the even-numbered rows on the display panel are divided in a manner opposite to the above manner.

For example, in each pixel unit, the number of the virtual pixels is the same as a sum of the number of the third sub-pixels and the number of the fourth sub-pixels in the pixel units. That is, for example, the first pixel unit 51 comprises one third sub-pixel G1 and one fourth sub-pixel G2, and the first pixel unit 51 forms two virtual pixels.

The luminance value calculation process of the two virtual pixels in each pixel unit is specifically described below by taking the first pixel unit as an example. In the following descriptions, the third sub-pixel G1 and the fourth sub-pixel G2 are green sub-pixels, the first sub-pixel R1 and the fifth sub-pixel R2 are red sub-pixels, and the second sub-pixel B1 and the sixth sub-pixel B2 are blue sub-pixels.

For example, as shown in FIG. 6, in some examples, in the first pixel unit 51, the fourth sub-pixel G2 and the sixth sub-pixel B2 form a first virtual pixel, and the first sub-pixel R1 and the third sub-pixel G1 form a second virtual pixel. As shown in FIG. 6, a first logic pixel 511 comprises a first logic sub-pixel R1', a second logic sub-pixel B1', and a third logic sub-pixel G1', and a second logic pixel 512 comprises a fourth logic sub-pixel G2', a fifth logic sub-pixel R2', and a sixth logic sub-pixel B2'. The first logic sub-pixel R1' and the fifth logic sub-pixel R2' are red sub-pixels, the second logic sub-pixel B1' and the sixth logic sub-pixel B2' are blue sub-pixels, and the third logic sub-pixel G1' and the fourth logic sub-pixels G2' are green sub-pixels. The logical pixel is not an actually existing pixel, and the sub-pixels in the virtual pixel are sub-pixels that actually exist in the pixel arrangement structure. Each logic pixel can independently display various colors in the color space, but each virtual pixel can only display a part of colors in the color space. For example, the virtual pixel cannot display pure white color. In the present disclosure, the logic pixel represents coordinate finding and base color brightness that are set by an image signal system and are irrelevant to physical structures (that is, the constitution, the repeating distribution method and the like of the first repeating unit and the second repeating unit in the pixel arrangement structure provided by the present disclosure) of the display device.

Data signals of the first logic pixel 511 and the second logic pixel 512 may be converted to data signals of the first virtual pixel and the second virtual pixel, respectively. For example, if luminance values of the first logic sub-pixel R1', the second logic sub-pixel B1', the third logic sub-pixel G1', the fourth logic sub-pixel G2', the fifth logic sub-pixel R2', and the sixth logic sub-pixel B2' are r1', g1', b1', g2', r2', and b2', respectively, in the first pixel unit 51, the luminance value r1 of the first sub-pixel R1 can be expressed as:

$$r1 = \sqrt[2.2]{\frac{r1'^{2.2} + r2'^{2.2}}{2}}.$$

The luminance value b2 of the sixth sub-pixel B2 can be expressed as:

$$b2 = \sqrt[2.2]{\frac{b1'^{2.2} + b2'^{2.2}}{2}}.$$

The luminance value g1 of the third sub-pixel G1 can be expressed as: g1=g2'.

The luminance value g2 of the fourth sub-pixel G2 can be expressed as: g2=g1'.

It should be noted that the division manner of the pixel units shown in FIG. 5 is only illustrative, and the division manner of the pixel units can be designed according to actual driving requirements.

Figure 7:
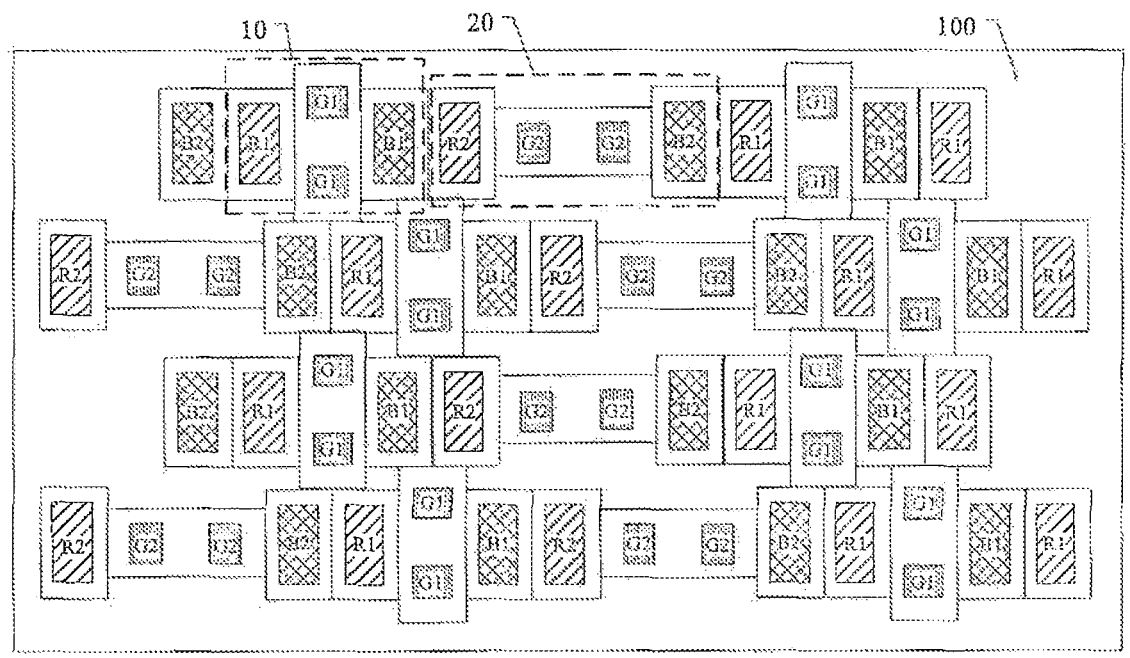
FIG. 7 is a schematic diagram of a display substrate provided by an embodiment of the present disclosure.

FIG. 7 is a schematic diagram of a display substrate provided by an embodiment of the present disclosure.

For example, as shown in FIG. 7, the display substrate provided by the embodiment of the present disclosure may comprise a base substrate 100 and a plurality of sub-pixels disposed on the base substrate. The plurality of sub-pixels may adopt the pixel arrangement structure according to any of the above embodiments. For example, FIG. 7 shows the pixel arrangement structure shown in FIG. 1A.

For example, the display substrate may be applied to a liquid crystal display panel, and may also be applied to an organic light emitting diode display panel.

For example, the display substrate may be an array substrate. In the first repeating unit 10, the first sub-pixel R1 comprises a first color pixel electrode and a first color light emitting layer arranged on the first color pixel electrode, the second sub-pixel B1 comprises a second color pixel electrode and a second color light emitting layer arranged on the second color pixel electrode, and the third sub-pixel G1 comprises a third color pixel electrode and a third color light emitting layer arranged on the third color pixel electrode. In the second repeating unit 20, the fourth sub-pixel G2 comprises a fourth color pixel electrode and a fourth color light emitting layer arranged on the fourth color pixel electrode, the fifth sub-pixel R2 comprises a fifth color pixel electrode and a fifth color light emitting layer arranged on the five color pixel electrode, and the sixth sub-pixel B2 comprises a sixth color pixel electrode and a sixth color light emitting layer arranged on the sixth color pixel electrode.

For example, a shape of the first color pixel electrode is the same as a shape of the first sub-pixel R1, and the first color pixel electrode is configured to drive the first color light emitting layer to emit light; a shape of the second color pixel electrode is the same as a shape of the second sub-pixel B1, and the second color pixel electrode is configured to drive the second color light emitting layer to emit light; and a shape of the third color pixel electrode is the same as a shape of the third sub-pixel G1, and the third color pixel electrode is configured to drive the third color light emitting layer to emit light. A shape of the fourth color pixel electrode is the same as a shape of the fourth sub-pixel G2, and the fourth color pixel electrode is configured to drive the fourth color light emitting layer to emit light; a shape of the fifth color pixel electrode is the same as a shape of the fifth sub-pixel R2, and the fifth color pixel electrode is configured to drive the fifth color light emitting layer to emit light; and a shape of the sixth color pixel electrode is the same as a shape of the sixth sub-pixel B2, and the sixth color pixel electrode is configured to drive the sixth color light emitting layer to emit light.

For example, the first color light emitting layer and the fifth color light emitting layer are configured to emit light of the same color (for example, red color), the second color light emitting layer and the sixth color light emitting layer are configured to emit light of the same color (for example, blue color), and the third color light emitting layer and the fourth color light emitting layer are configured to emit light of the same color (for example, green color).

For example, in a case where the display substrate is applied to a liquid crystal display panel, the display substrate may also be a color filter substrate. In the first repeating unit 10, the first sub-pixel R1 comprises a first color filter, the second sub-pixel B1 comprises a second color filter, and the third sub-pixel G1 comprises a third color filter. In the second repeating unit 20, the fourth sub-pixel G2 comprises a fourth color filter, the fifth sub-pixel R2 comprises a fifth color filter, and the sixth sub-pixel B2 comprises a sixth color filter.

For example, the first color filter and the fifth color filter are filters of the same color, the second color filter and the sixth color filter are filters of the same color, and the third color filter and the fourth color filter are filters of the same color. For example, the first color filter and the fifth color filter may be red filters, the second color filter and the sixth color filter may be blue filters, and the third color filter and the fourth color filter may be green filters.

Figure 8:
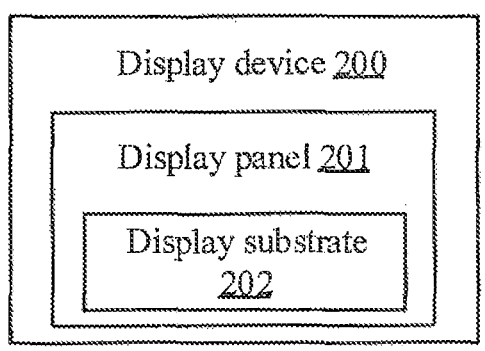
FIG. 8 is a schematic block diagram of a display device provided by an embodiment of the present disclosure.

FIG. 8 is a schematic block diagram of a display device provided by an embodiment of the present disclosure.

For example, as shown in FIG. 8, the display device 200 provided by the embodiment of the present disclosure comprises a display panel 201, and the display panel 201 comprises the display substrate 202 according to any of the above embodiments.

For example, the display panel 201 may be a liquid crystal display panel, an organic light emitting diode (OLED) display panel, or the like. Where the display panel 201 is the liquid crystal display panel, the display substrate 202 may be an array substrate or a color filter substrate. Where the display panel 201 is the organic light emitting diode display panel, the display substrate 202 may be an array substrate.

For example, the display device 200 may be any product or component having a display function, such as a mobile phone, a tablet computer, a television, a display, a notebook computer, a digital photo frame, a navigator, and the like.

It should be noted that those of ordinary skill in the art should understand that the display device 200 may also comprise other components (for example, a control device, an image data encoding/decoding device, a line scan driver, a column scan driver, a clock circuit, etc.), which are not described in detail and are not intended to limit the present disclosure.

Figure 9:
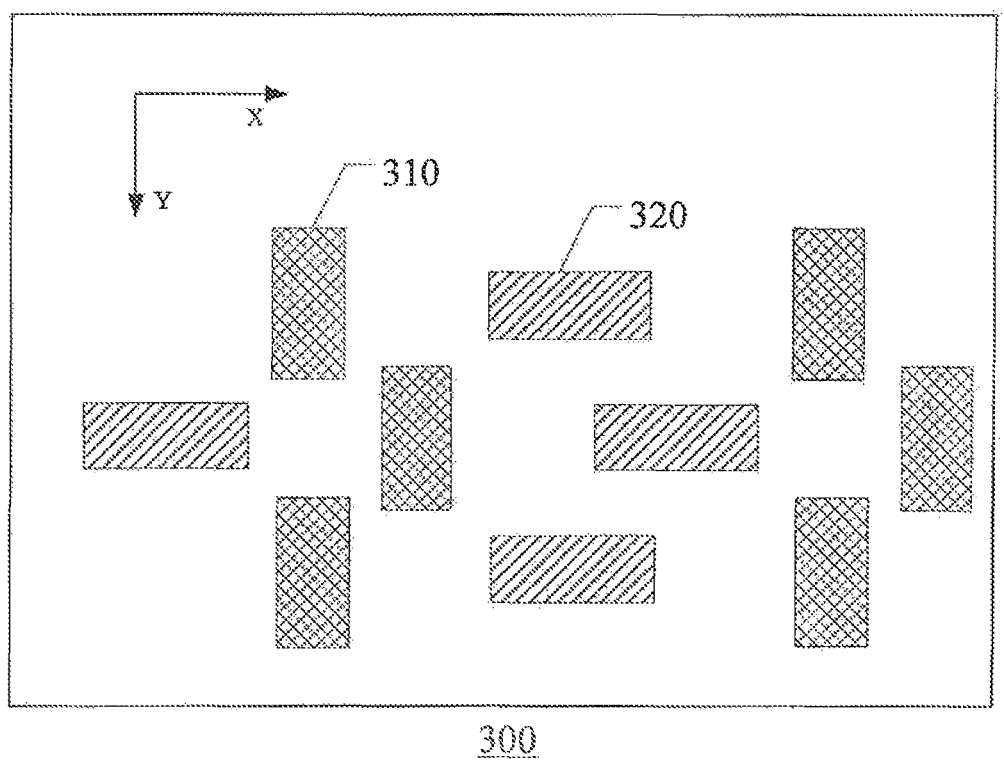
FIG. 9 is a schematic diagram of a mask provided by an embodiment of the present disclosure.

FIG. 9 shows a mask provided by an embodiment of the present disclosure. The mask is used to form the third sub-pixels and the fourth sub-pixels in the pixel arrangement structure provided by any one of the above examples.

For example, as shown in FIG. 9, the mask 300 comprises a first opening 310 and a second opening 320. The first opening 310 is used for forming the two third sub-pixels in the first repeating unit; and the second opening 320 is used for forming the two fourth sub-pixels of the second repeating unit.

For example, a length of the first opening 310 along the second direction Y is greater than a length of the first opening 310 along the first direction X, and a length of the second opening 320 along the second direction Y is smaller than a length of the second opening 320 along the first direction X.

For the present disclosure, the following several statements should be noted:

(1) The accompanying drawings involve only the structure(s) in connection with the embodiment(s) of the present disclosure, and other structure(s) can be referred to common design(s).

(2) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:

1. A pixel arrangement structure, comprising: a first repeating unit and a second repeating unit,
   wherein the first repeating unit comprises a first sub-pixel, a second sub-pixel, and two third sub-pixels, and the second repeating unit comprises two fourth sub-pixels, a fifth sub-pixel, and a sixth sub-pixel,
   in a first direction, the two third sub-pixels are between the first sub-pixel and the second sub-pixel, and the two fourth sub-pixels are between the fifth sub-pixel and the sixth sub-pixel,
   the two fourth sub-pixels are arranged along the first direction, the two third sub- pixels are arranged along a second direction, and the first direction and the second direction are not parallel to each other;
   an area of the first sub-pixel and an area of the second sub-pixel are both greater than an area of either of the two third sub-pixels, and an area of the fifth sub-pixel and an area of the sixth sub-pixel are both greater than an area of either of the two fourth sub-pixels.

2. The pixel arrangement structure according to claim 1, wherein the first repeating unit and the second repeating unit are arranged along the first direction.

3. The pixel arrangement structure according to claim 1, wherein in the first direction, the second sub-pixel and the fifth sub-pixel are adjacent to each other, and the second sub-pixel and the fifth sub-pixel are configured to display different colors, respectively.

4. The pixel arrangement structure according to claim 1, wherein the first direction and the second direction are perpendicular to each other.

5. The pixel arrangement structure according to claim 1, wherein the first repeating unit and the second repeating unit are alternately arranged along the first direction to form a repeating unit row, and a plurality of repeating unit rows are arranged along the second direction.

6. The pixel arrangement structure according to claim 5, wherein in the second direction, an extension line of a line connecting centers of the two third sub-pixels of the first repeating unit in an even-numbered row of the plurality of repeating unit rows does not coincide with an extension line of a line connecting centers of the two third sub-pixels of the first repeating unit in an odd-numbered row of the plurality of repeating unit rows.

7. The pixel arrangement structure according to claim 6, wherein the extension line of the line connecting the centers of the two third sub-pixels of the first repeating unit in the odd-numbered row passes through a center of an interval between the first repeating unit and the second repeating unit, which are adjacent, of the even-numbered row.

8. The pixel arrangement structure according to claim 5, wherein a distance between centers of the two third sub-pixels is greater than a half of a length of the first sub-pixel along the second direction, and a distance between centers of the two fourth sub-pixels is greater than a half of a length of the fifth sub-pixel along the second direction, a minimum distance, along the second direction, between boundaries of third sub-pixels of two first repeating units which are in adjacent odd-numbered ows of the plurality of repeating unit rows and in a same column is greater than 1.5 times of the length of the first sub-pixel along the second direction.

9. The pixel arrangement structure according to claim 8, wherein in the first direction, the second sub-pixel of the first repeating unit and the fifth sub-pixel of the second repeating unit are adjacent to each other, and the first sub-pixel of the first repeating unit and the sixth sub-pixel of the second repeating unit are adjacent to each other,
    in the first repeating unit, a minimum distance between boundaries of the two third sub-pixels along the second direction is greater than a minimum distance between a boundary of the second sub-pixel and a boundary of the fifth sub-pixel that is adjacent to the second sub-pixel along the first direction, and/or the minimum distance between the boundaries of the two third sub-pixels along the second direction is greater than a minimum distance between a boundary of the first sub-pixel and a boundary of the sixth sub-pixel that is adjacent to the first sub-pixel along the first direction;
    in the second repeating unit, a minimum distance between boundaries of the two fourth sub-pixels along the first direction is greater than the minimum distance between the boundary of the second sub-pixel and the boundary of the fifth sub-pixel that is adjacent to the second sub-pixel along the first direction, and/or the minimum distance between the boundaries of the two fourth sub-pixels along the first direction is greater than the minimum distance between the boundary of the first sub-pixel and the boundary of the sixth sub-pixel that is adjacent to the first sub-pixel along the first direction.

10. The pixel arrangement structure according to claim 1, wherein in the first repeating unit, a minimum distance between boundaries of the two third sub-pixels along the second direction is greater than a half of a length of one of the two third sub-pixels along the second direction, and is smaller than a length of the first sub-pixel along the second direction,
    in the second repeating unit, a minimum distance between boundaries of the two fourth sub-pixels along the first direction is greater than a half of a length of one of the two fourth sub-pixels along the first direction, and is smaller than a length of the fifth sub-pixel along the second direction.

11. The pixel arrangement structure according to claim 1, wherein two first repeating units constitute a first repeating unit group, and two second repeating units constitute a second repeating unit group, in the first direction, the first repeating unit group and the second repeating unit group are alternately arranged, in the first repeating unit group, the two first repeating units are arranged along the first direction; in the second repeating unit group, the two second repeating units are arranged along the first direction.

12. The pixel arrangement structure according to claim 1, wherein in the first repeating unit, a line connecting a center of the first sub-pixel and a center of the second sub-pixel is a first center line, and a line connecting centers of the two third sub-pixels is a second center line, the two third sub-pixels are symmetrically arranged with respect to the first center line, and the first sub-pixel and the second sub-pixel are symmetrically arranged with respect to the second center line.

13. The pixel arrangement structure according to claim 1, wherein in the second repeating unit, a line connecting a center of the fifth sub-pixel and a center of the sixth sub-pixel is a third center line, the two fourth sub-pixels are symmetrically arranged with respect to a perpendicular bisector of the third center line, and the fifth sub-pixel and the sixth sub-pixel are also symmetrically arranged with respect to the perpendicular bisector of the third center line.

14. The pixel arrangement structure according to claim 13, wherein in the second repeating unit, centers of the two fourth sub-pixels are on the third center line.

15. The pixel arrangement structure according to claim 1, wherein a length of the first sub-pixel in the second direction is greater than a length of the first sub-pixel in the first direction, and a length of the second sub-pixel in the second direction is greater than a length of the second sub-pixel in the first direction;
    a length of the fifth sub-pixel in the second direction is greater than a length of the fifth sub-pixel in the first direction, and a length of the sixth sub-pixel in the second direction is greater than a length of the sixth sub-pixel in the first direction.

16. The pixel arrangement structure according to claim 1, wherein the first sub-pixel and the fifth sub-pixel are red sub-pixels, the second sub-pixel and the sixth sub-pixel are blue sub-pixels, and the two third sub-pixels and the two fourth sub-pixels are green sub-pixels.

17. A display substrate, comprising:
a base substrate; and
a plurality of sub-pixels on the base substrate,
wherein the plurality of sub-pixels adopt the pixel arrangement structure according to claim 1.

18. A display device, comprising the display substrate according to claim claim 17.

19. A mask, being used for forming a pixel arrangement structure, wherein the pixel arrangement structure comprises: a first repeating unit and a second repeating unit,
    the first repeating unit comprises a first sub-pixel, a second sub-pixel, and two third sub-pixels, and the second repeating unit comprises two fourth sub-pixels, a fifth sub-pixel, and a sixth sub-pixel,
    in a first direction, the two third sub-pixels are between the first sub-pixel and the second sub-pixel, and the two fourth sub-pixels are between the fifth sub-pixel and the sixth sub-pixel,
    the two fourth sub-pixels are arranged along the first direction, the two third sub- pixels are arranged along a second direction, and the first direction and the second direction are not parallel to each other,
    the mask comprises:
    a first opening, configured to form the two third sub-pixels; and
    a second opening, configured to form the two fourth sub-pixels, wherein a length of the first opening along the second direction is greater than a length of the first opening along the first direction, and a length of the second opening along the second direction is smaller than a length of the second opening along the first direction.

20. A pixel arrangement structure, comprising: a first repeating unit and a second repeating unit,
- wherein the first repeating unit comprises a first sub-pixel, a second sub-pixel. and two third sub-pixels, and the second repeating unit comprises two fourth sub-pixels, a fifth sub-pixel, and a sixth sub-pixel,
- in a first direction, the two third sub-pixels are between the first sub-pixel and second sub-pixel, and the two forth sub-pixels are between the fifth sub-pixel and the sixth sub-pixel,
- the two forth sub-pixels are arranged along the first direction, the two third sub-pixels are arranged along a second direction, and the first direction and the second direction are not parrallel to each other;
- the two third sub-pixels and the two fourth sub-pixels are green sub-pixels.

\* \* \* \* \*